United States Patent [19]

Ohashi

[11] Patent Number: 4,616,516

[45] Date of Patent: Oct. 14, 1986

[54] PUSH-BUTTON TUNER

[75] Inventor: Tamaki Ohashi, Tokyo, Japan

[73] Assignee: Nihon Technical Kabushiki Kaisha, Tokyo, Japan

[21] Appl. No.: 652,349

[22] Filed: Sep. 19, 1984

[30] Foreign Application Priority Data

Sep. 19, 1983 [JP] Japan .................................. 58-171207
Sep. 19, 1983 [JP] Japan .................................. 58-171208

[51] Int. Cl.⁴ ............................................. H03J 5/12
[52] U.S. Cl. ...................................... 74/10.33; 334/7
[58] Field of Search ........................... 74/10.33; 334/7

[56] References Cited

U.S. PATENT DOCUMENTS

| | | | |
|---|---|---|---|
| 3,412,619 | 11/1968 | Pelletier | 334/7 X |
| 3,722,299 | 3/1973 | Knight et al. | 334/7 X |
| 4,010,652 | 3/1977 | Sugimoto et al. | 334/7 X |
| 4,041,784 | 8/1977 | Ohashi | 334/7 X |
| 4,079,631 | 3/1978 | Chaki | 334/7 X |

FOREIGN PATENT DOCUMENTS 55-27719  2/1980  Japan ................................... 334/7

Primary Examiner—Allan D. Herrmann
Attorney, Agent, or Firm—Robert E. Burns; Emmanuel J. Lobato; Bruce L. Adams

[57] ABSTRACT

Disclosed is a push-button tuner having a plurality of push-buttons which are preset so as to tune in to preset frequencies of broadcasting stations, in which an actuator plate for setting the positions of variable tuning elements by depressing the push-buttons is divided into a plurality of actuator plate components and the variable tuning elements are allotted to the actuator plate components, the push-buttons being grouped corresponding to the actuator plate components, thereby reducing the actuator plate in size as well as in weight so that it is possible to tune in to the frequency of a desired broadcasting station with a light pressing force.

9 Claims, 13 Drawing Figures

FIG. 9
FIG. 10
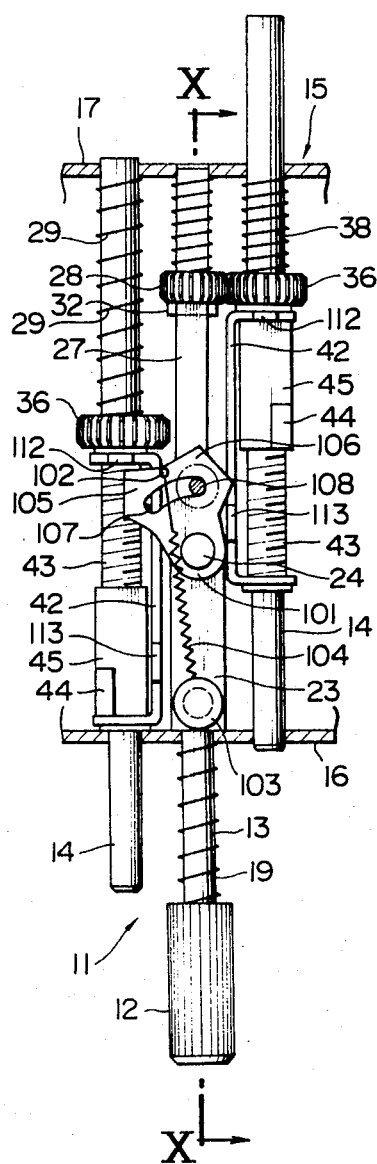
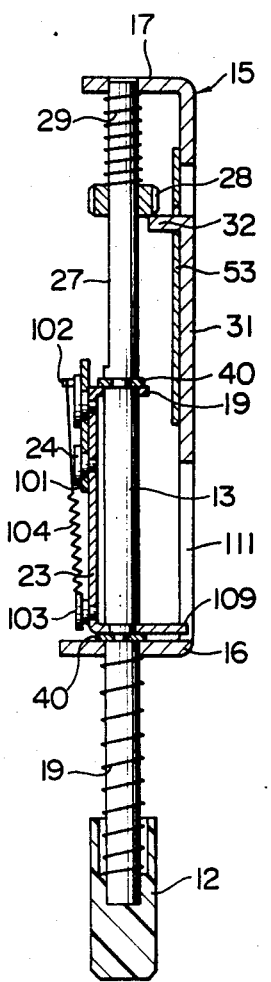

FIG.11
FIG.12
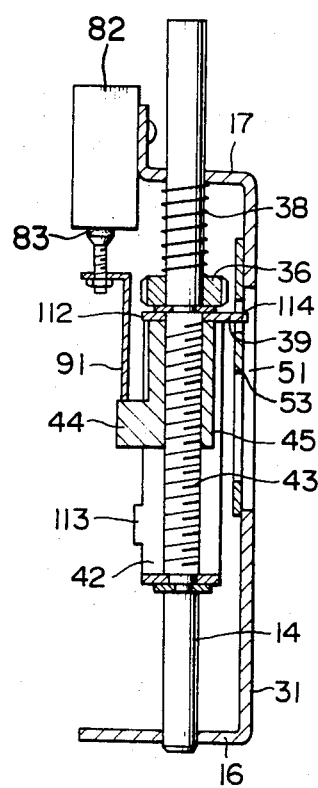
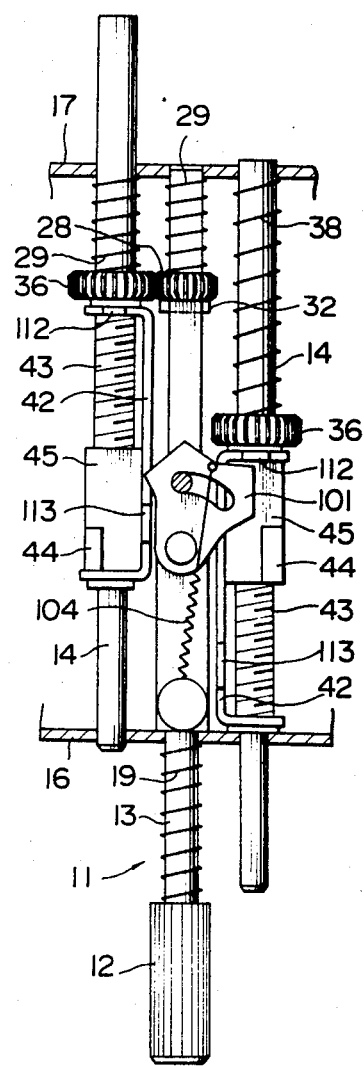

PUSH-BUTTON TUNER

BACKGROUND OF THE INVENTION

1. Field of the Invention

The present invention relates generally to push-button tuners for radio receivers and more particularly to a push-button tuner in which two preset broadcasting frequencies can be desiredly selectively tuned in by each push-button.

2. Description of Prior Art

Widely known is a push-button tuner comprising a plurality of push-buttons each of which is set to tune in to a preset broadcasting frequency so that a desired broadcasting frequency is tuned in by depressing a selected one of the push-buttons into its actuated position. In such a push-button tuner, usually, only one broadcasting station could be selected by one push-button so that in order to tune in to several broadcasting stations by push-buttons it has been necessary to provide several push-buttons corresponding to the number of broadcasting stations. To increase the number of push-buttons, however, it is necessary to enlarge, in the direction perpendicular to the axial direction of a tuning shaft, the length of an actuator plate which moves as the tuning shaft moves to thereby define the position of a variable tuning element. In the case where the length of the actuator plate is elongated, however, there is a tendency for the actuator plate incline in the direction of movement when a tuning shaft near each of opposite ends of a tuner is retracted. If the actuator plate inclines, there are disadvantages that not only the smooth movement of the actuator plate is made difficult but there is a possibility of causing an erroneous tuning operation. In a push-botton tuner which is intended to be reduced in size, it is necessary to reduce the depth of the actuator plate and there is a strong possibility that the actuator plates will incline.

SUMMARY OF THE INVENTION

An object of the present invention is to provide a push-button tuner which has a capability of tuning in to several broadcasting stations with an actuator plate having no tendency to incline.

In order to attain the object, according to the present invention, the push-button tuner comprises a support, a tuning means mounted on the support in a manner so that the tuning means is movable to positions corresponding to tuned frequencies for producing the tuned frequencies, and a plurality of presettable tuning mechanisms for adjusting the tuning means to move selectively to positions respectively corresponding to specific frequencies, in which each of the tuning mechanisms comprises: a rotatable operation member movable between a front non-actuation position and a rear actuation position, the operation member being normally urged to the front non-actuation position, the operation member having a drive rotary body and a push-button provided at an end of the operation member, the push-button being used also as a rotating knob; a rotatable tuning member having a driven rotary body for selectively engaging with the drive rotary body to rotate together with the drive rotary body, the rotatable tuning member being supported in a manner so that the rotatable tuning member is normally urged to the front non-actuation position while it is movable between the front non-actuation position and the rear actuation position, the rotatable tuning member having a longitudinally extending threaded portion at a part of the surface thereof and a tuning piece engaged with the threaded portion, the tuning piece being movable in the frontward/rearward direction in response to the rotation of the tuning member; the tuning means including a plurality of actuator plates engaging with the tuning piece of the tuning member in the rear actuation position to adjust the tuning means, each of the actuator plates cooperating with a preset number of the tuning mechanisms, each of the actuator plates being provided with a variable tuning element; and in which the push-button tuner further comprises a lock member for holding any one of the tuning members so as to permit the transmission of rotation between the drive rotary body and the driven rotary body when one tuning member is located in the rear actuation position and for releasing the tuning member held in the rear actuation position when another tuning member is disposed in the rear actuation position.

BRIEF DESCRIPTION OF THE DRAWINGS

FIG. 9 is a partly cut-away plan view of the tuning mechanism of FIG. 8;

FIG. 10 is a longitudinal sectional view taken on line 10—10 in FIG. 9;

FIG. 11 is a longitudinal sectional view taken on line 11—11 in FIG. 8;

FIG. 12 is a plan view showing the tuning mechanism of FIG. 8 when in operation.

DESCRIPTION OF PREFERRED EMBODIMENTS

Figure 1:
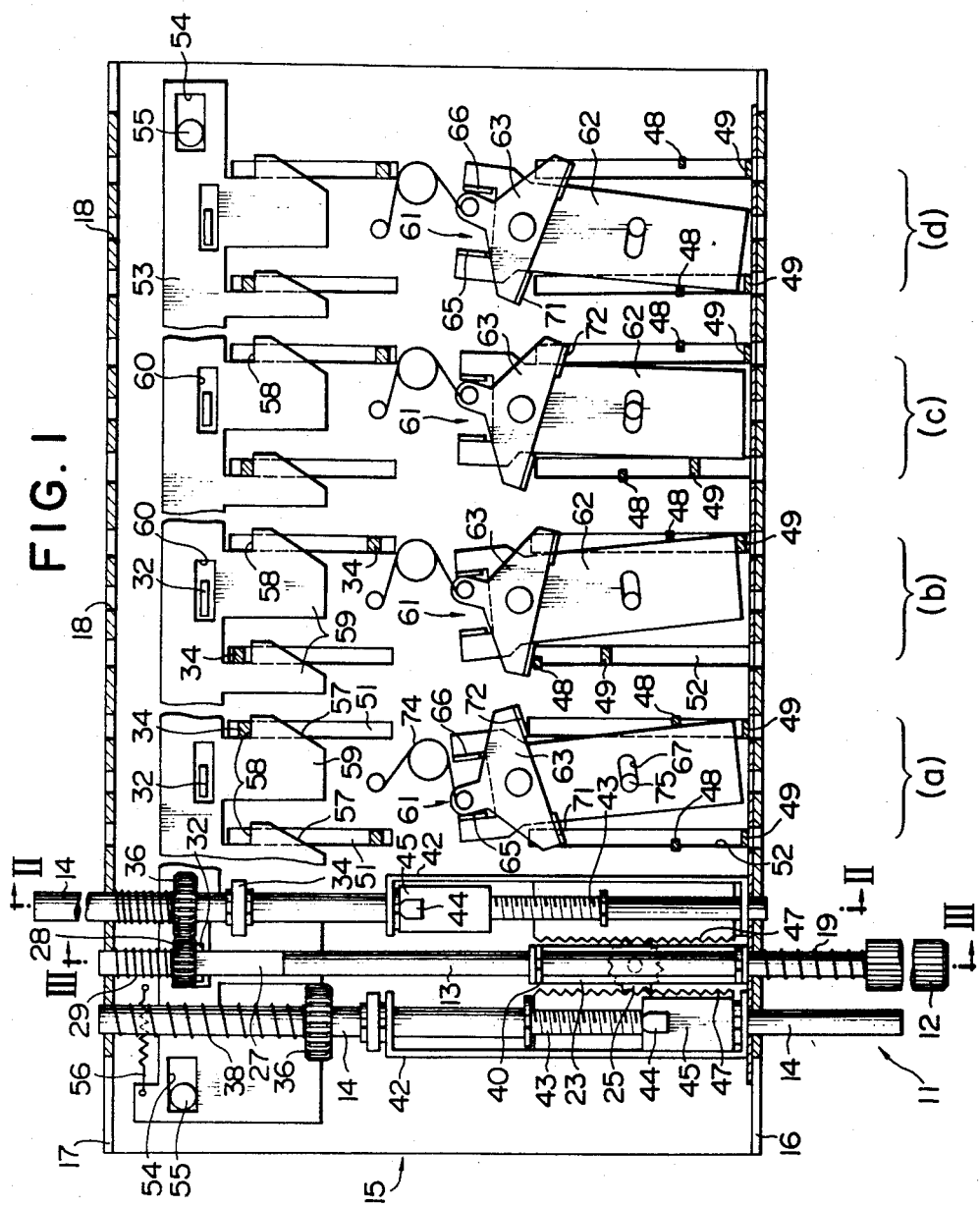
FIG. 1 is a plan view with parts omitted of a first embodiment of the push-button tuner according to the present invention.
Figure 2:
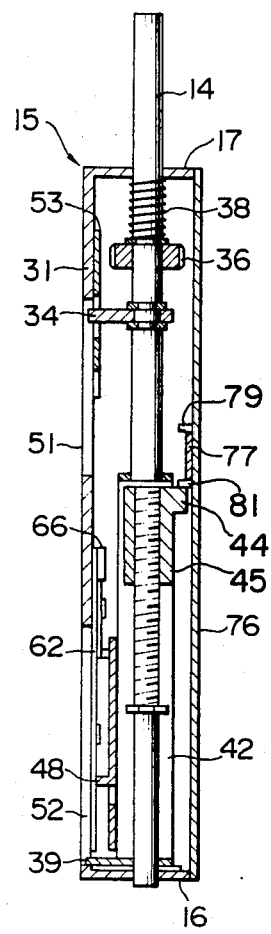
FIG. 2 is a longitudinal sectional view taken on line 2—2 in FIG. 1.
Figure 3:
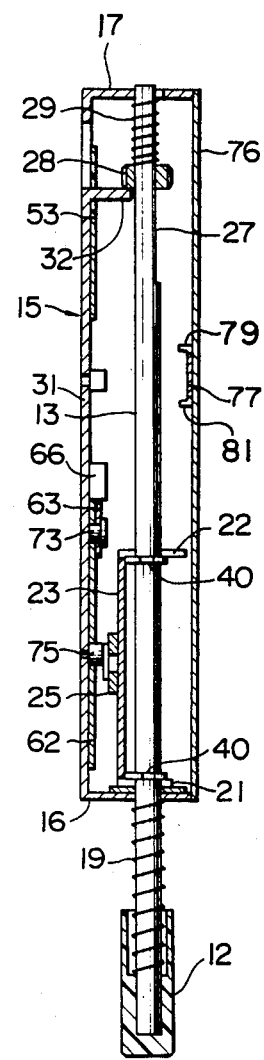
FIG. 3 is a longitudinal sectional view taken on line 3—3 in FIG. 1.
Figure 4:
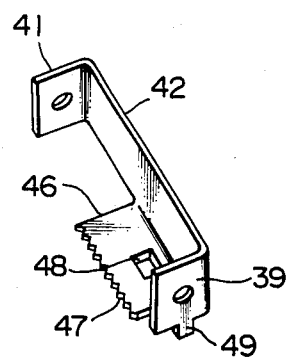
FIG. 4 is a perspective view showing in detail the guide member of FIG. 5.
Figure 5:
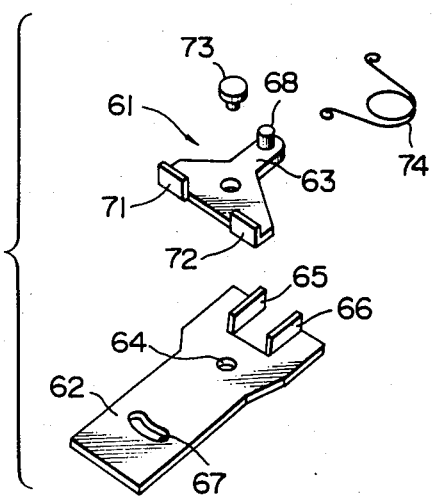
FIG. 5 is an exploded perspective view of the change-over mechanism of FIG. 1.

Referring to the drawings, preferred embodiments of the present invention will now be described. The same element is designated by the same reference numeral in the embodiments and the explanation as to the same element as described in the preceding embodiment is omitted in the description of the succeeding embodiments.

Referring to FIGS. 1 to 7, a first embodiment of the present invention will be described. In this embodiment, ten broadcasting stations are tuned to by five sets of tuning mechanisms each having a push-button. Since each of the tuning mechanisms has the same construction, only one of the tuning mechanisms is described and illustrated. The tuning mechanism is generally designated by reference numeral 11 and has a cylindrical push-button 12 attached at its forward end, an operation shaft 13 attached to the push-button 12, and two tuning shafts 14 and 14 are respectively arranged on opposite sides of shaft 13 that is its right and and left sides, as seen in the drawing. In the following description, the word "front" is used to designate the ene of shaft 13 at which the push-button 12 is attached and the word "rear" is used to designate the other end. The respective front and rear of the operation shaft 13 and the tuning shafts 14 and 14 are movably received and supported by holes 18 formed in front-end and rear-end rising portion 16 and 17 of a support plate 15.

A helical spring 19 for elastically displacing the operation shaft 13 to bias the operation shaft 13 normally toward member 16 is positioned on shaft 13 between push-button 12 and the front-end rising portion 16. A support member 23 having flanges 21 and 22 at its two ends is provided on the operation shaft 13 between the front-end and rear-end portions 16 and 17 such that the operation shaft 13 passes through holes formes in the flanges 21 and 22 so as to be supported by the support member 23. Support member 23 is maintained on the operation shaft 13 as by stops 40 so that it is free to move in a rotary direction relatively to the operation shaft 13 but is prevented from moving in an axial direction operation shaft 13. When push-button 12 is released, the bent or flange 21 of support member 23 is normally in contact with the rear surface of front-end rising portion 16 in order to restrict the outward movement of operation shaft 13 under the force of the spring 19. A pin 24 is provided centrally in the rear surface of support member 23 and a pinion 25 is rotatably mounted on pin 24. A portion 27 of operation shaft 13 is axially partly cut away so as to make its cross-section non-circular and a drive gear 28 is fitted onto this non-circular portion such that it is free to slide in the axial direction of operation shaft 13 while being prevented from movement in the rotary direction. A helical spring 29 is mounted on the operation shaft 13 between drive gear 28 and the rear-end rising portion 17 so as to bias drive gear 28 toward the front at all times. The other surface of the drive gear 28 opposite the surface in contact with the helical spring 29 strikes an abutment 32 which is cut out and bent from a bottom plate 31 of the support plate 15 so as to restrict the movement of the drive gear 28 in an axial direction along operation shaft 13. Each of the two tuning shafts 14 and 14 which cooperate with the operation shaft 13 has the same structure. Each tuning shaft 14 supported to be rotatable and is slidably at its front and rear ends by the front-end and rear-end rising portions or walls 16 and 17 of support plate 15. A gear 36 having a diameter larger than that of the drive gear 28 is mounted on each tuning shaft 14 rear its rear portion. A helical spring 38 is mounted on each tuning shaft 14 between the driven gear 36 and rim 17 for biasing the tuning shaft 14 toward the front at all times. A guide member 42 having bent portions 39 and 41 at its opposite ends is mounted on each tuning shaft 14 between an engagement/stopper portion 34 and the front-end rising portion or wall 16 so that the portion of guide member 42 between its opposite bent portions 39 and 41 is perpendicular to the surface of the bottom plate 31 of the support plate 15 and the guide member 42 is swingable is prevented from axial movement by an abutment 40. That is, the tuning shaft 14 loosely passes through through holes (not shown) formed in the respective bent portions 39 and 41. A threaded portion 43 is formed on tuning shaft 14 between the ends of guide member 42 and a tuning piece 45 is engaged with the threaded portion 43, the tuning piece 45 having an upwardly projecting memory protrusion 44 formed on its upper surface. As shown best in FIG. 4, the guide member 42 has, in addition to the bent end portions 39 and 41, a lower flange 46 which is parallel to with the bottom plate 31 of support plate 15, and has a rack portion 47 formed along its a longitudinal side edge which engages with pinion 25, and has a downwardly projecting portion 48, and a protrusion 49 is integrally formed at a lower portion of bent portion 39. In bottom plate 31 of support 15, there is a first elongated guide slot 51 which engages with the front end of the engagement/stopper portion 34 for guiding the forward and rearward movement of the latter, and a second elongated guide slot 52 which engages with the protrusion 49 of the guide member 42 for guiding the frontward/rearward movement of the latter. Each of the first and second elongated slots 51 and 52 is located directly below the tuning shaft 14 and longitudinally extended in the axial direction of the tuning shaft 14.

A lock plate 53 is provided which is movable perpendicularly to the operation shaft 13 on the rear portion of the bottom plate 31 of the support plate 15. Longitudinally elongated holes 54 are formed in the longitudinally opposite ends of the lock plate 53, and pins 55 respectively supported by the bottom plate 31 are fitted in the elongated holes 54 so as to restrain the amount of movement of the lock plate 53 in the left-right direction. One of a spring 56 is attached to the bottom plate 31 and the outer end is attached to the lock plate 53 so as to elastically bias rightward the lock plate 53. A cam member 59 is formed in the front edge of the lock plate 53, and provided with a ramp edge 57 which is formed in order to engage with the engagement/stopper portion 34 when the tuning shaft 14 retreats and to temporarily displace the lock plate 53 in the leftward direction in FIG. 1 against the spring 56, and with an engagement/stopper step portion 58 which is formed in the rear portion of the edge 57 and which engages with and stops the engagement/stopper portion 34. In the lock plate 53, elongated holes 60 extending in the left-right direction are formed at points corresponding to the shafts 13 when the engagement/stopper portions 34 are engaged with first elongated guide slots 51 through the elongated holes 60.

The front portion of the bottom plate 31 of the support plate 15 is provided with a change-over mechanism 61 for alternately preventing the left and right tuning shafts 14 from. The change-over mechanism 61 is provided with a longitudinal swing plate 62 and a pivotal plate 63 which is disposed at the rear side of the swing plate 62. The swing plate 62 is provided with a hole 64 at its middle portion, a pair of rising portions 65 and 66 opposite to and separated from each other at its rear portion, and a circularly-arced connecting hole 67 at its front portion. The rear portion of the pivotal plate 63 is disposed between the pair of rising portions 65 and 66, and a pin 68 is secured in this rear portion. A hole 69 registered with the hole 64 and a pair of contact portions 71 and 72 engaging with the portion 48 of the guide member 42 are formed in the center of the front portion of the pivotal plate 63. A pivot axis 73 is inserted into the holes 64 and 69 registered with each other and is fixedly attached at its lower end to the bottom plate 31 so that the swing plate 62 and the pivotal plate 63 are rotatably supported. The two ends of a snap spring 74 are respectively attached to the bottom plate 31 and the pin 68 of the pivotal plate 63 so as to elastically bias the pivotal plate 63 in one direction. The swing plate 62 of the change-over mechanism 61 is disposed between a pair of left and right second guide slots 52 such that the front edge of the swing plate 62 closes either the left-hand or right hand second guide slot 52 when the swing plate 62 inclines either to the left or right. Further, a connecting pin 75 with its one end attached to the bottom plate 31 is fitted in the hole 67 which is in opposition to the portion 48 of the guide member 42 attached to the left and right tuning shafts 14 and in opposition to the contact portions 71 and 72 of the pivotal plate 63.

Figure 7:
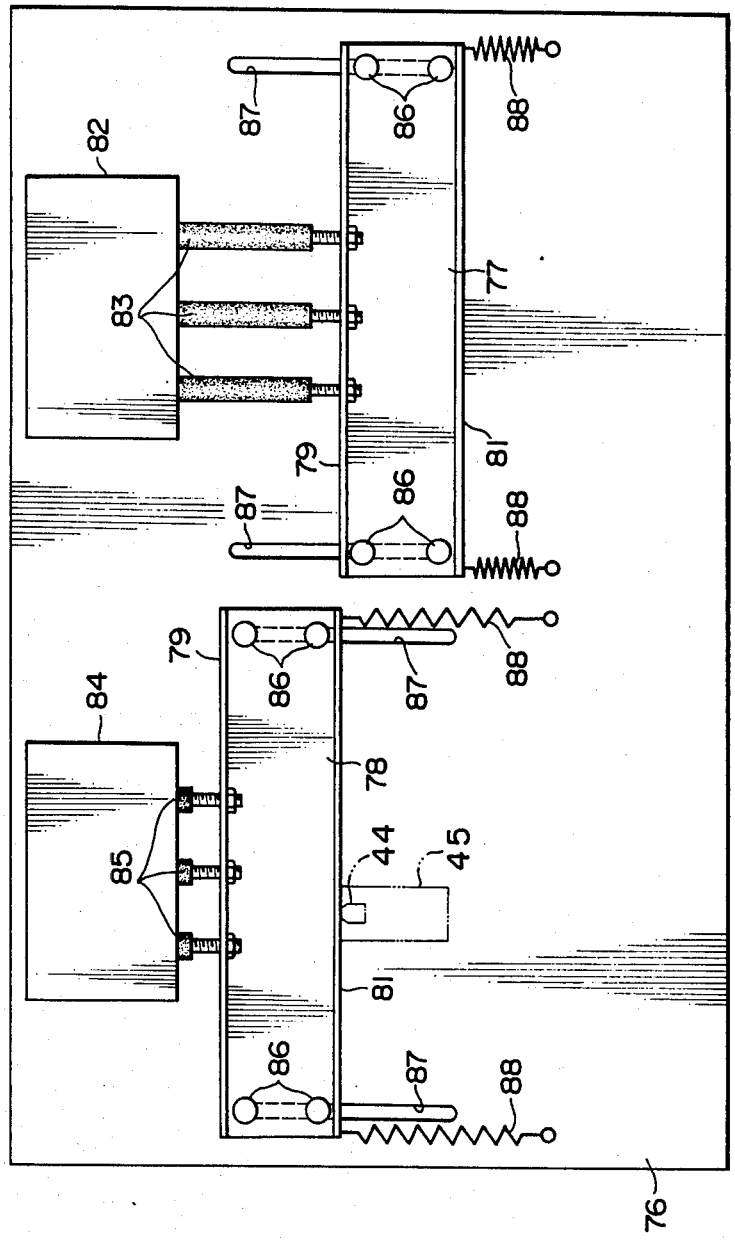
FIG. 7 is an internal view showing the relation between the upper plate and the actuator plate in the first embodiment.

An upper plate 76 is provided on the respective upper ends of the front-end rising portion 16 and the rear-end rising portion 17 of the support plate 15. A pair of first and second movable actuator plates 77 and 78 are longitudinally provided on the back of the upper plate 76, as shown in FIG. 7. The first actuator plate 77 is disposed over the first and the second tuning mechanisms 11 as seen from the left-hand in FIG. 1 and the left-hand tuning shaft 14 of the central tuning mechanism. The second actuator plate 78 is disposed over the rest of the tuning mechanisms 11 and the right-hand tuning shaft 14 of the central tuning mechanism 11. The bent portions 79 and 81 which are substantially perpendicularly bent downward are formed on each of the actuator plates 77 and 78 at opposite ends in the direction of movement thereof. The bent portions 79 of the respective actuator plate 77 and 78 are connected with respective magnetic cores 85 and 85 of a first and a second variable tuning element 82 and 83. Each of the bent portions 81 is in contact with the tuning pieces 45 of the respective tuning mechanisms 11. On the opposite side portions of each of the first and second actuator plates 77 and 78, upwardly projecting pins 86 are secured and separated from each other and aligned in the direction of the actuator plate. Elongated holes 87 extending in the direction of movement of the first and second actuator plates 77 and 78 are formed in the upper plate 76 corresponding to the pins 86, and the pins 86 are loosely fitted into these elongated holes 87 so that the first and second actuator plate 77 and 78 can be moved in the rearward/frontward direction. At each of the longitudinally opposite ends of each of the first and second actuator plates 77 and 78, a spring 88 is attached at one end, the other end of the spring 88 being fixedly attached to the upper plate 76, so that the actuator plates 77 and 78 are always elastically biased frontwardly.

Figure 8:
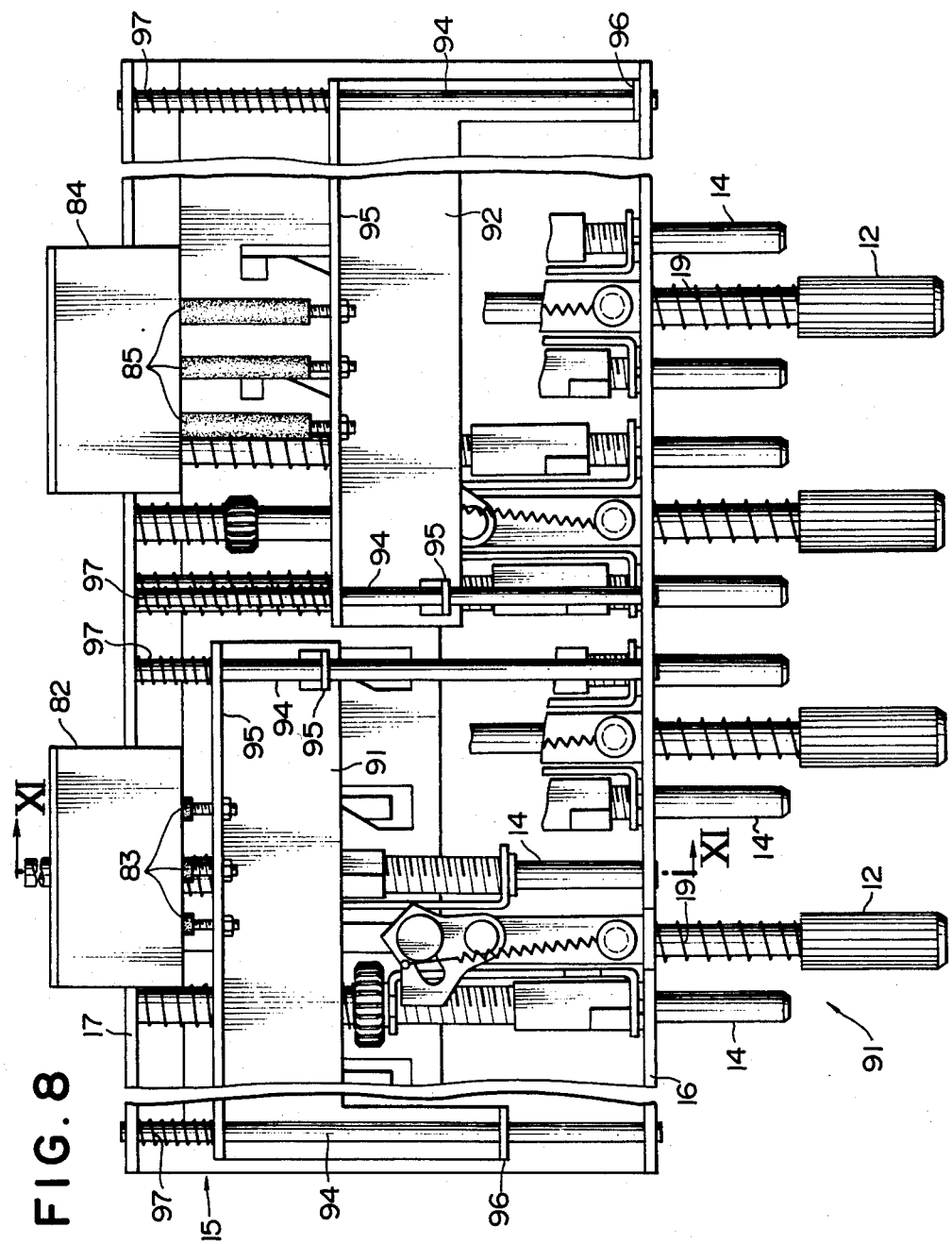
FIG. 8 is a plan view with parts omitted showing a second embodiment according to the present invention.
Figure 13:
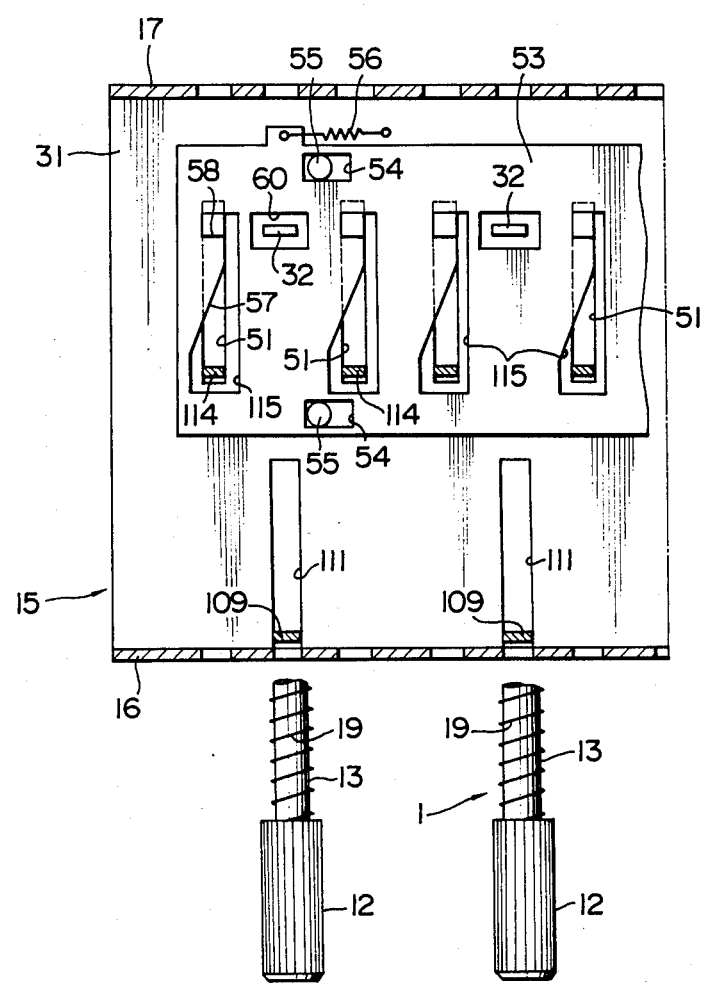
FIG. 13 is a plan view showing the relationship between the support plate and the lock plate.

In FIG. 1, the tuning shaft 14 located at the right side of the operation shaft 13 has moved rearwardly and the engagement/stopper 34 is engaging with the step portion 58 of the lock plate 53 so that the left-hand tuning mechanism 11 is maintained in its retracted state. The operation shaft 13, the guide member 42 of the right-hand tuning shaft 14 and the left-hand tuning shaft 14 are in their returned state. Assume that, at that time, both the swing plate 62 and the pivotal plate 63 of the change-over mechanism 61 have been rotated in the counterclockwise direction, as shown at (a) in FIG. 1. This state is shown in FIG. 8, and when the push-button 12 is turned in this state, the right-hand tuning shaft 14 rotates because the drive gear 28 meshes with the driven gear 36. The turning of the tuning shaft 14 causes the tuning piece 45 to move in the rearward/frontward direction on the tuning shaft 14. The side surface of the tuning piece 45 is in contact with the vertical side surface of the guide member 42 so that the tuning piece 45 can move without turning. The top of the memory protrusion 44 of the tuning piece 45 is in contact with the bent portion 81 of the actuator plate 78 so that the actuator plate 78 moves against the elastic force of a spring 88 according to the movement of the tuning piece 45. Consequently, the variable tuning element 84 is varied so that a desired radio station can be tuned in. After tuning, the selection of the desired radio station is fixed and memorized until the operation shaft 13 is rotated again.

Thus, after the desired radio station has been memorized in the right-hand tuning shaft 14 by means of the movement stroke of the tuning piece 45, the push-button 12 is depressed. As described above, the change-over mechanism 61 is in a state such that a part of the front edge of the rotated swing plate 62 crosses the right-hand second elongated guide slot 52. Therefore, the protrusion 49 of the guide member 42 of the retracted right-hand tuning shaft 14 is prevented from moving rearwardly by means of the front edge of the swing plate 62. Therefore, the pinion 25 is guided by the right-hand rack 47 and it moves rearwardly while rotating. The guide member 42 of the left-hand tuning shaft 14 with its rack 47 meshed with the pinion 25 moves rearwardly by an amount corresponding to the rotation of the pinion 25, and the pushing stroke of the operation shaft 13 is added thereto, so that the guide member 42 moves rearwardly with the stroke which is twice as large as the pushing stroke of the operation shaft 13. The engagement/stopper portion 34 is made to be in contact with the bent portion 41 of the guide member 42 by means of the return spring 38 so that the tuning shaft 14 moves rearwardly integrally with the guide member 42. In that case, the engagement/stopper portion 34 cooperates with the ramp edge 57 of the lock plate 53, and a transverse movement force against the spring 56 is temporarily applied to the lock plate 53. Consequently, the engagement between the engagement/stopper portion 34 of the right-hand tuning shaft 14 maintained at the rear and the engagement/stopper stepped portion 58 is released, so that the right-hand tuning shaft 14 is returned frontwardly by means of the return spring 38 independently of the guide member 42. On the other hand, the bent portion 81 of the actuator plate 78 which retracts as the right-hand tuning shaft 14 returns comes in contact with the memory protrusion 44 of the left-hand tuning shaft 14 which has been retracted with the operation shaft 13. Further, due to the engagement between the engagement/stopper portion 34 of the left-hand tuning shaft 14 and the engagement/stopper stepped portion 58 of the lock plate 53, the left-hand tuning shaft 14 is maintained at the rear position, and at this time the left-hand driven gear 36 meshes with the drive gear 28 as shown in FIG. 6.

Figure 6:
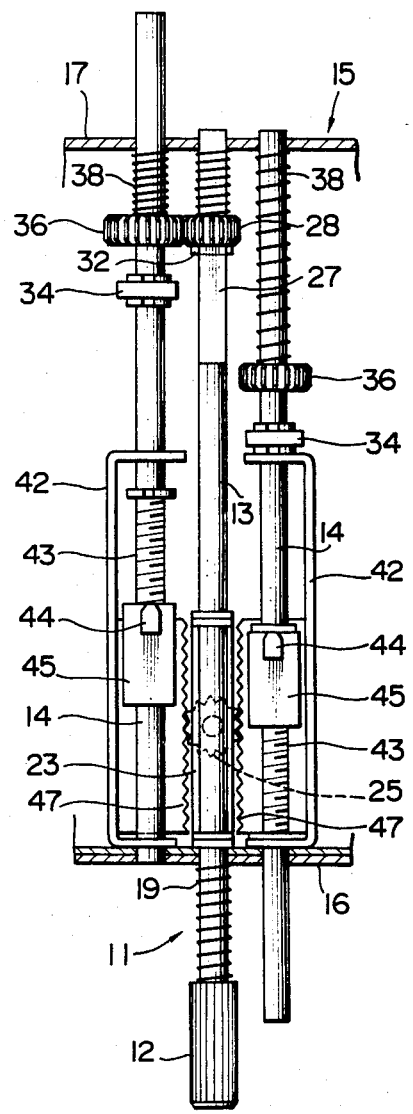
FIG. 6 is a partial plan view showing the tuning mechanism of FIG. 1 when in operation.

When the depressing pressure on the push-button 12 is removed in the state shown in FIG. 6, both the left-hand and right-hand guide members 42 are retracted and the drive gear 28 and the driven gear 36 are maintained in their meshed state. Next, the push-button 12 is turned in this state, and the turning is transmitted to the left-hand tuning shaft 14 so that the tuning shaft 14 is rotated. As described above, the driven gear 36 has a diameter which is larger than that of the drive gear 28 so that the tuning shaft 14 can be finely rotated. The rotation of the tuning shaft 14 causes the tuning piece 45 to slide on the tuning shaft 14 so that the variable tuning element 84 is varied finely through the actuator plate 78 to thereby select another desired radio station which is stored by means of the movement stroke of the tuning piece 45.

The operation of the change-over mechanism 61 will be described now. FIG. 1 shows, at (a) to (d), the operation steps of the change-over mechanism 61 which is changed over every cycle of reciprocation of the operation shaft 13. In the state maintained by the snap switch 74 such that both the pivotal plate 63 and the swing plate 62 lean in the counterclockwise direction as shown at (a) in FIG. 1, the portion 48 provided on the left-hand guide member 42 strikes the contact portion 71 of the pivotal plate 63 in its path. Therefore, as shown at (b) in FIG. 1, the pivotal plate 63 moves clockwise and strikes at its leg end against the first rising portion 66, so that a clockwise pivotal force is given to the swing plate 62. When the depressing pressure on the push-button 12 is removed in this state so that the left-hand guide member 42 is retracted together with the operation shaft 13 through the engagement of member 25, the protrusion 49 retracts while sliding along the side edge of the swing plate 62 as shown at (c) in FIG. 1. In the state where the guide member 42 has been returned sufficiently, the swing plate 62 pivots in the clockwise direction so as to traverse the left-hand second elongated guide slot 52, and this state is maintained by the snap spring 74. Thus, the change-over mechanism 61 is reversibly changed over alternately in the left and right directions at every reciprocation of the operation shaft 13.

Thus, after desired radio stations have been respectively memorized in all the tuning shafts 14 provided on the support plate 15, if a desired one of the push-buttons 12 is depressed and the operation shaft 13 is moved rearwardly, one of the tuning shafts 14 which is able to retract is moved frontwardly at the same time. The radio station which has been memorized in the tuning piece 45 can be received through the variable tuning element by means of the contact between the memory protrusion 44 of the tuning piece 45 of the tuning shaft 14 which has been moved and the front bent portion 81 of the actuator plate 78.

Referring to FIGS. 8 to 13, a second embodiment of the present invention will be now described. In this embodiment, eight broadcasting stations are selectively tuned in by four tuning mechanisms. An actuator plate is divided into two actuator plates 91 and 92 each movably supported at its opposite end portions extending parallelly with each other in the direction of movement thereof by a pair of guide rods 94. That is, each of the actuator plates 91 and 92 has at its rear end portion in the direction of movement a rear-end rising portion 95 formed by upwardly bending the end portion by about 90 degrees, and has at its front end portion in the direction of movement a front-end rising portion 96 which is similar to the rear-end rising portion 95 but is formed only at a portion below the guide rod 94. While not shown in the drawing, the rising portions 95 and 96 respectively have through holes into which the guide rod 94 is inserted. Springs 97 are provided on the respective guide rods 94 at portions thereof between a rear-end rising portion 17 of a support plate 15 and the respective rear-end rising portions 95 of the actuator plates 91 and 92 so as to always frontwardly bias the actuator plates 91 and 92.

The tuning mechanism in this embodiment will be described next. A change-over lever 101 is pivotally mounted at its intermediate portion on a pin 24 of a support member 23. A pin 102 is mounted in the change-over lever 101 at its rear end portion, and a spring 104 is provided between the pin 102 and a pin 103 mounted in the support member 23 at its front end portion for applying an elastic tensile force to the change-over lever 101 such that when the rear end of the change-over lever 101 inclines somewhat leftward/rightward with respect to the direction of movement of an operation shaft 13, it is caused to further incline in the same direction. The rear end of the change-over lever 101 has a wide width such that a substantially V-shaped pair of tongue portions 105 and 106 are formed. A circularly arced slot 107 is formed in the wide width portion such that it extends across the tongue portions 105 and 106, and a pin 108 mounted in the upper surface of the support member 23 is received in this slot 107. Thus, the range of pivotal movement of the change-over lever 101 is limited by the cooperation between the pin 108 and the slot 107. A front bent portion 109 of the support member 23 is longer than the bent portion 21 of the previously described first embodiment and the end of this front bent portion 109 is receive a guide hole 111 formed in a bottom plate 31 of the support plate 15. This guide hole 111 extends in the direction of movement of the operation shaft 13 so as to guide the support member 23 to slide in the frontward/rearward direction. An engagement/stopper portion 112 is formed at an upper end center of a rear bent portion 39 of the guide member 42 of each tuning shaft 14 so as to cooperate with the change-over shaft 14 to cause the tuning shaft 14 to move rearwardly. This engagement/stopper portion 112 engages with the front edge of the tongue portion 105 or 106 of the change-over lever 101 so as to cause the tuning shaft 14 to advance in the same direction as the operation shaft 13 when the operation shaft 13 is advanced to the rearwardly-displaced position. A protrusion 113 is formed in the front side-edge upper surface of the guide member 42. This protrusion 113 engages with the rear edge of one of the tongue portions 105 and 106 of the change-over lever 101 to change the change-over lever 101 to the other.

A lower engagement/stopper portion 114 is formed in the lower-end center of the front bent portion 39 of the guide member 42 and fitted into an engagement slot 115 formed in a lock plate 53. Similarly to the first embodiment, the engagement slot 115 is formed with a ramp edge 57 and an engagement/stopper stepped portion 58.

When a push-button 12 is rearwardly and is in the state shown in FIG. 9, the rear edge of the left-hand tongue portion 105 of the change-over lever 101 strikes the engagement/stopper portion 112 of the guide member 42 of the left-hand tuning shaft 14 to displace the tuning shaft 14 rearwardly. The lower engagement/stopper portion 114 of the guide member 42 moves rearwardly together with the tuning shaft 14 and engages with the ramp edge 57 to cause the lock plate 53 to move left in FIG. 13. Thus, the engagement between the lower engagement/stopper portion 114 of the guide member of the right-side tuning shaft 14 and the engagement/stopper stepped portion 58 of the engagement slot 115 is released so that the right-hand tuning shaft 14 is caused to come back frontwardly by a spring 38. The lower engagement/stopper portion 114 of the guide member 42 of the left-hand tuning shaft 14 reaches the engagement/stopper stepped portion 58 from the ramp edge 57 and is locked by this engagement/stopper stepped portion 58. If the push-button 12 is released in this state, the operation shaft 13 is caused to return by the spring 29. In this returning operation, the front edge of the tongue portion 105 of the change-over lever 101 strikes against the protrusion 113 of the left-hand tuning shaft 14 to cause the change-over lever 101 to rotate clockwise. At this time, if the line connecting the pins 24 and 102 of the change-over lever 101 inclines to the right even a slight amount, the change-over lever is caused by the spring 104 to rotate to the right to the extent allowed by the slot 107 and the pin 108. Thus, the change-over lever 101 is alternately swung clockwise and counterclockwise by the striking action of every reciprocation of the operation shaft 13.

Although the push-button tuner is arranged by a tuning mechanism in which two broadcasting stations are selectively tuned in by each push-button in the second embodiment, it is a matter of course that the push-button tuner may be arranged by a tuning mechanism in which only one broadcasting station is tuned by each push-button. In the latter case, it is sufficient to make the change-over lever 101 fixedly in contact with the engagement/stopper portion 112 of each tuning shaft 14. Accordingly, not only the spring 104 and the pins 24 and 102 at the opposite ends of the spring 104, but the slot 107 and the pin 108 become unnecessary.

What is claimed is:

1. A push-button tuner comprising a support, a tuning means mounted on said support in a manner so that said tuning means is movable to positions corresponding to tuned frequencies for producing the tuned frequencies, and a plurality of presettable tuning mechanisms for adjusting said tuning means to move selectively to positions respectively corresponding to specific frequencies, in which each of said tuning mechanisms comprises:

a rotatable operation member movable between a front non-actuation position and a rear actuation position, said operation member being normally urged to said front non-actuation position, said operation member having a drive rotary body and a push-button provided at an end of said operation member, said push-button being used also as a rotating knob;

a rotatable tuning member having a driven rotary body for selectively engaging with said drive rotary body to rotate together with said drive rotary body, said rotatable tuning member being supported by said support in a manner so that said rotatable tuning member is normally urged to said front non-actuation position while it is movable between said front non-actuation position and said rear actuation position, said rotatable tuning member having a longitudinally extending threaded portion at a part of the surface thereof and a tuning piece engaged with said threaded portion, said tuning piece being movable in the frontward/rearward direction in response to the rotation of said tuning member;

said tuning means including a plurality of actuator plates engaging with said tuning piece of said tuning member in said rear actuation position to adjust said tuning means, each of said actuator plates cooperating with preset number of said tuning mechanisms, each of said actuator plates being provided with a variable tuning element; and in which said push-button tuner further comprises a lock member for holding any one of said tuning members so as to permit the transmission of rotation between said drive rotary body and said driven rotary body when said one tuning member is located in said rear actuation position and for releasing said one tuning member held in said rear actuation position when another tuning member is disposed in said rear actuation position.

2. A push-button tuner according to claim 1, in which said plurality of actuator plates are frontward/rearward movably supported by an upper plate member provided on said support in a manner so as to cover said plurality of tuning mechanisms.

3. A push-button tuner according to claim 1, in which said plurality of actuator plates are frontward/rearward movably supported by a guide rod member supported at its opposite ends by said support at the front and rear ends thereof.

4. A push-button tuner according to claim 1, in which said driven rotary body has a diameter larger than that of said drive rotary body.

5. A push-button tuner according to claim 1, in which said drive rotary body is mounted on said operation member slidably in the axial direction of said operation member, said operation member including means for urging said drive rotary body to said front non-actuation position and a restriction member for restricting the position of said drive rotary body in a manner so that rotation is allowed to be transmitted from said drive rotary body to said driven rotary body when said tuning member is held in said rear actuation position.

6. A push-button tuner according to claim 1, in which said actuator plates are separately disposed at a predetermined distance on said tuning member and supported by said support slidably in the same direction as the direction of movement of said tuning piece.

7. A push-button tuner according to claim 1, in which a pair of said tuning members are provided at the opposite sides of said operation member, and in which each of said tuning mechanisms includes an engagement mechanism supported by said operation member and engaging with said pair of tuning members in a manner so as to alternately displace said pair of tuning members relative to said operation member in the direction toward said rear actuation position.

8. A push-button tuner according to claim 7, further comprising an enlargement mechanism for transmitting an enlarged amount of displacement of said operation member in the direction toward said rear actuation position to said tuning member movable to said rear actuation position.

9. A push-button tuner according to claim 8, in which said enlargement mechanism includes a support member movable in response to the frontward/rearward movement of said operation member, a pinion horizontally rotatably mounted on said support member, and a guide member movable in response to the frontward/rearward movement of said operation member and having a rack engaging with said pinion.

* * * * *